United States Patent
Seto et al.

(10) Patent No.: US 6,172,408 B1
(45) Date of Patent: Jan. 9, 2001

(54) RADIATION-SENSITIVE SEMICONDUCTOR DEVICE AND METHOD OF MANUFACTURING SAME

(75) Inventors: Myron W. L. Seto; Stienke De Jager; Henricus G. R. Maas, all of Eindhoven (NL)

(73) Assignee: U.S. Philips Corporation, New York, NY (US)

( * ) Notice: Under 35 U.S.C. 154(b), the term of this patent shall be extended for 0 days.

(21) Appl. No.: 09/273,282

(22) Filed: Mar. 19, 1999

(30) Foreign Application Priority Data

Mar. 19, 1998 (EP) .................................................. 98200882

(51) Int. Cl.[7] ...................... H01L 31/075; H01L 31/105; H01L 31/117; H01L 37/14
(52) U.S. Cl. .......................... 257/458; 257/428; 257/436
(58) Field of Search .................................. 257/428, 436, 257/437, 458

(56) References Cited

U.S. PATENT DOCUMENTS

| | | | |
|---|---|---|---|
| 5,268,039 | * 12/1993 | Vogeli et al. | 135/256 |
| 5,525,828 | 6/1996 | Bassous et al. | 257/457 |
| 5,923,071 | * 7/1999 | Saito | 257/458 |

* cited by examiner

Primary Examiner—Mahshid Saadat
Assistant Examiner—Allan R. Wilson

(74) Attorney, Agent, or Firm—Leroy Eason

(57) ABSTRACT

The invention relates to a radiation-sensitive device comprising a thin radiation-sensitive element (2), in particular a thin photodiode (2). The device includes a substrate (1) on which a photodiode (2) is provided. The surface (5) of the photodiode serves as a semi-pervious mirror (5) through which the radiation (100) enters; a reflecting layer (6) situated between the photodiode (2) and the substrate (1) also serves as a mirror (6). As a result, a so-called resonant cavity effect is possible, resulting, inter alia, in wavelength selectivity of the device. The known device has insufficient wavelength selectivity, which, in addition, cannot readily be set in an accurate and reproducible manner.

A device in accordance with the invention is characterized in that the reflecting layer (6) is a metal layer (6) and in that the photodiode (2) is secured to the substrate (1) by means of an adhesive layer (7). By virtue of the high reflectivity of one (6) of the two mirrors (5, 6), the device has a great wavelength selectivity which, in addition, can be readily set in an accurate and reproducible manner. The adhesive layer (7) does not only enable the photodiode (7) to be secured to a substrate (1), which does not have to be a semiconductor substrate, but, this method of securing also enables a very attractive manufacturing method for the entire device to be achieved. A device in accordance with the invention can be advantageously used as a detector in a heterodyne or multiplex optical communication system or in an optical disc system.

7 Claims, 4 Drawing Sheets

RADIATION-SENSITIVE SEMICONDUCTOR DEVICE AND METHOD OF MANUFACTURING SAME

BACKGROUND OF THE INVENTION

The invention relates to a radiation-sensitive semiconductor device comprising a semiconductor body including a substrate carrying a semiconductor layer, which is thin relative to the substrate and which comprises a radiation-sensitive semiconductor material, in which semiconductor layer a semiconductor element having electrical connections is formed which is sensitive to electromagnetic radiation incident on the surface of the semiconductor body, and radiation-reflecting means being provided between the substrate and the semiconductor layer. The invention also relates to a method of manufacturing such a device.

Such a device can very suitably be used as a detector in various optical systems, such as an optical glass fiber communication system or an optical disc system. By virtue of the small thickness of the semiconductor layer and the presence of the reflection means, the radiation-sensitive element can be of the so-called resonant-cavity type, that is the radiation to be detected traverses the radiation-sensitive layer a number of times. As a result, also radiation which is only very little absorbed by the radiation-sensitive semiconductor material can be satisfactorily detected. By virtue of the small thickness of the semiconductor layer, the semiconductor element formed therein still has a high response rate. The response of such a device exhibits a periodical variation in the wavelength domain. This enables the response to be accurately attuned to the wavelength of the radiation to be detected. If this wavelength is situated in or near the visible part of the spectrum, the device is hardly sensitive to (visible) background radiation. Consequently, the device can be regarded as a monolithic integration of a detector and a filter.

Such a device and method are known from U.S. Pat. No. 5,525,828, published on Jun. 11, 1996. Said known device comprises (see for example FIG. 20) a photodiode which is formed in a relatively thin semiconductor layer of silicon which is situated on a silicon substrate and separated therefrom by a first electrically insulating layer of silicon dioxide which serves as a mirror for the radiation incident on the semiconductor layer. At the upper side of the thin semiconductor layer, i.e. where the radiation to be detected is incident, there is also an electrically insulating layer, which is also made of silicon dioxide and which also serves as a (partly pervious) mirror. Said known device comprises two semiconductor regions which are recessed in the surface and situated at some distance from each other, said semiconductor regions being, respectively, of the n-conductivity type and the p-conductivity type and provided with electrical connections.

A drawback of the known device is that the wavelength selectivity thereof is insufficient for certain applications. Besides, it is also difficult to attune the properties of the device to a desired wavelength.

SUMMARY OF THE INVENTION

Therefore, it is an object of the present invention to provide a device having a great wavelength selectivity and properties which can be set accurately and reproducibly. The invention also aims at providing a method by means of which the desired device can be manufactured in a simple manner.

To achieve this, a device of the type mentioned in the opening paragraph is characterized in accordance with the invention in that the radiation-reflecting means comprise a metal layer bordering on the semiconductor layer, and the semiconductor layer provided with a metal layer is secured to the substrate by means of an adhesive layer. The invention is first of all based on the recognition that the desired properties of the device, such as the wavelength selectivity, depend upon the reflectivities of both mirrors and that, first of all, the reflectivity of the first mirror, that is the buried first insulating layer, must be determined by means of ellipsometry and reflection measurements in order to determine which reflectivity the second insulating layer should possess in order to realize, for example, a desired wavelength selectivity. The invention is further based on the recognition that if the reflectivity of the lower mirror is at least substantially equal to one, the desired value of the reflectivity of the upper mirror can be determined in a much simpler manner, namely by computing. By using a metal layer as the lower mirror, it is achieved in a simple manner that the reflectivity thereof is at least substantially equal to one. However, a metal layer buried in the semiconductor material cannot be obtained by means of a customary manufacturing process. The invention is further based on the recognition that the substrate does not necessarily have to consist of a semiconductor material, and that a relatively simple method of manufacturing a device in accordance with the invention is possible if the semiconductor layer provided with a metal layer is secured to the substrate by means of an adhesive layer. With respect to the known device, the functions of both mirrors have to be exchanged: the buried mirror will serve as a (semi-pervious) mirror so that the radiation to be detected is incident in the device, while the upper mirror is formed by providing the semiconductor layer with a metal layer instead of an insulating layer. Subsequently, the device is secured, on the side of the metal layer, to a substrate by means of an adhesive layer, which substrate may or may not be a semiconductor substrate. Subsequently, the original substrate is removed by means of selective etching, in which process the (buried) insulating layer serves as the etch-stop layer. Such a device has a very good (=great) wavelength selectivity and can be manufactured in an accurate and reproducible manner. In addition, the manufacture is relatively simple.

In a preferred embodiment of a device in accordance with the invention, further reflection means are situated at the surface of the semiconductor body and the thickness of the semiconductor layer is a small number of times the half wavelength of the electromagnetic radiation. Said reflection means may simply be formed by the transition from the semiconducting layer to air. In this case, the (first) insulating layer is removed after the removal of the semiconductor substrate, for example by etching. The reflectivity of the semiconductor-air transition is fixed and amounts to approximately 30%. By leaving the insulating layer, the reflectivity of said reflection means may be provided with another value, if desired. This can alternatively be achieved in an advantageous manner by providing said insulating layer with a further insulating layer of a material having a refractive index which differs from that of said insulating layer. By selecting the thickness of the semiconducting layer so as to be an integral number of times the half wavelength of the radiation to be detected, the device in accordance with the invention meets the most important condition created by a resonant cavity.

In a very favorable embodiment, the radiation-sensitive element comprises a photodiode having a first semiconductor region of a first conductivity type with a high doping concentration, and a second semiconductor region of a second conductivity type, which is opposite to the first conductivity type, and with a high doping concentration, and preferably, a third semiconductor region, situated between the first and the second semiconductor regions, which is of the first or the second conductivity type and has a low doping concentration, and the first and second semiconductor regions being provided with electrical connections. In an important variant of this embodiment, the semiconductor layer comprises a stack of epitaxial semiconductor layers which successively constitute the first, the third and the second semiconductor region. This variant has the important advantage that it is easy to manufacture because the layers of the diode with a high doping concentration can be provided together with the layer with a low doping concentration in a single epitaxial step. In another variant, the semiconductor layer comprises the second semiconductor region in which the first and the third semiconductor regions are formed, next to one another, as recessed regions. This variant has the advantage that it enables the surface of the pn-junction of the diode to be small, which implies that the capacitance can be small, which has a positive effect on the velocity of the device.

In a further embodiment, the metal layer also forms one of the electrical connections of the semiconductor element. By virtue thereof, the manufacture of, in particular, the above-mentioned other variant is simplified substantially.

Preferably, the substrate in a device in accordance with the invention is made of glass and an electrically insulating layer is situated between the metal layer and the adhesive layer. By virtue of such a substrate, the device is inexpensive. Also the adhesion by means of an adhesive layer on such a substrate is excellent. For the same reason, preferably also an electrically insulating layer is present between the metal layer and the adhesive layer. Such a layer often has a glass-like character and is preferably provided by means of CVD (=Chemical Vapor Deposition) or a plasma-deposition process. Such a layer may also compensate any differences in height of the structure, which function may, however, also be partly or entirely fulfilled by the adhesive layer. To plane such an insulating layer use may also be made of CMP (=Chemical Mechanical Polishing).

A method of manufacturing a device in accordance with the invention, in which a substrate is provided with a semiconductor layer, which is thin relative to the substrate, and which includes a radiation-sensitive semiconductor material, in which semiconductor layer a semiconductor element provided with electrical connections is formed, which is sensitive to electromagnetic radiation incident on the surface of the semiconductor device, and radiation-reflecting means being provided between the substrate and the semiconductor layer, is characterized in accordance with the invention in that a semiconductor substrate is provided with an electrically insulating layer above which the semiconductor layer is formed, in which the semiconductor element is formed, whereafter the semiconductor layer is covered with a metal layer forming the radiation-reflecting means, after which the substrate is secured onto the metal layer by means of an adhesive, and finally, the semiconductor substrate is removed by etching, in which process the electrically insulating layer serves as the etch-stop layer. Such a method enables a device in accordance with the invention to be obtained in a simple manner.

Preferably, the radiation-sensitive element is formed by creating, in the semiconductor layer, a first semiconductor region of a first conductivity type having a high doping concentration, a second semiconductor region of a second conductivity type, opposite to the first conductivity type, and, preferably, a third semiconductor region of the first or the second conductivity type, which is situated between the first and the second semiconductor regions and which has a low doping concentration, and the first and the second semiconductor regions being provided with electrical connections. The side of the semiconductor element facing the metal layer is preferably provided with further radiation-reflecting means which are formed by the electrically insulating layer.

These and other aspects of the invention will be apparent from and elucidated with reference to the embodiments described hereinafter.

Figure 1:
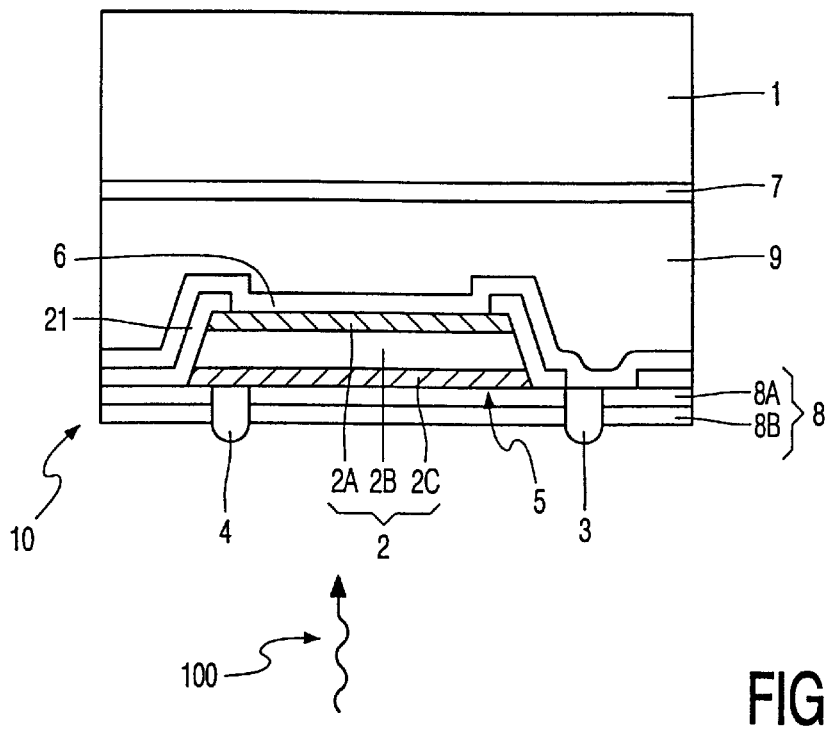
FIG. 1 is a schematic, cross-sectional view, at right angles to the thickness direction, of a first embodiment of a device in accordance with the invention.
Figure 2:
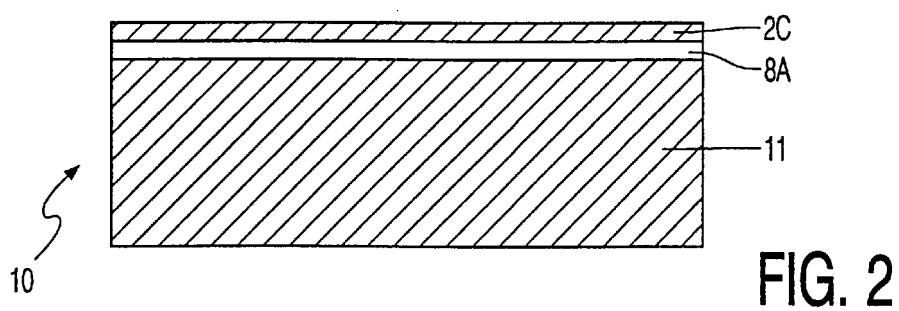
FIGS. 2 through 8 are schematic, cross-sectional views, at right angles to the thickness direction, of the device of FIG. 1, and show successive stages in the manufacture by means of a method in accordance with the invention.
Figure 3:
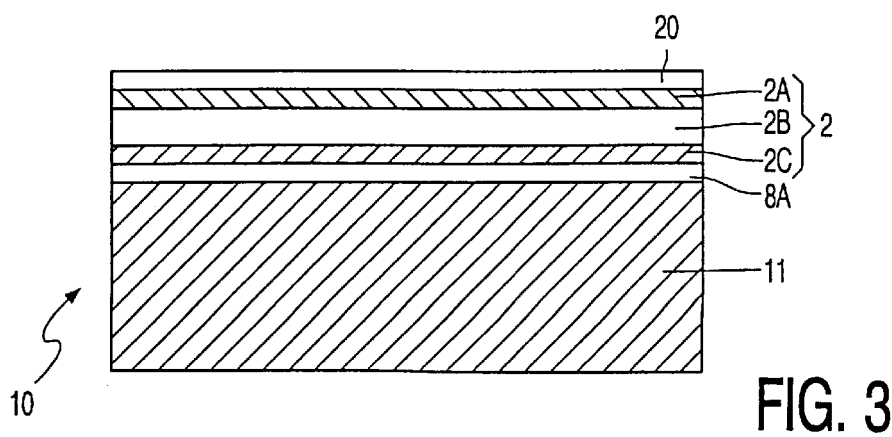
Figure 4:
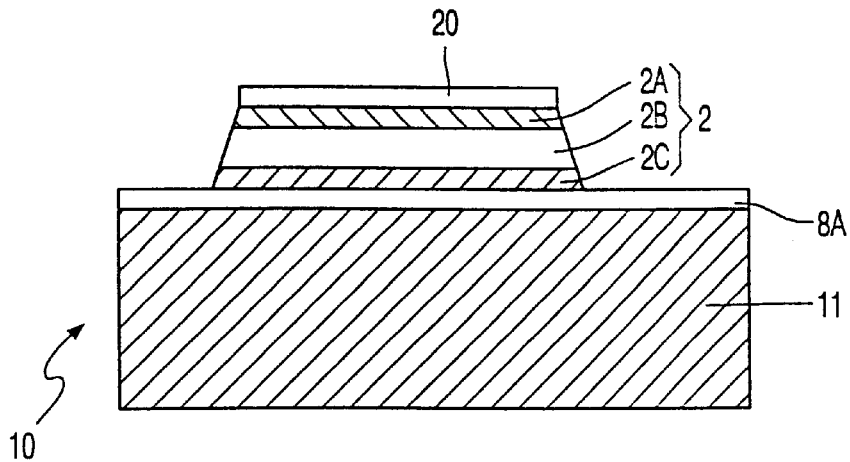
Figure 5:
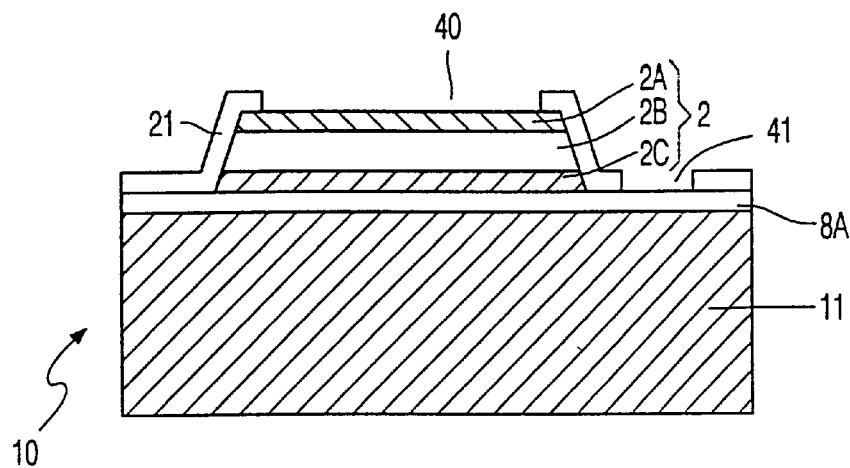
Figure 6:
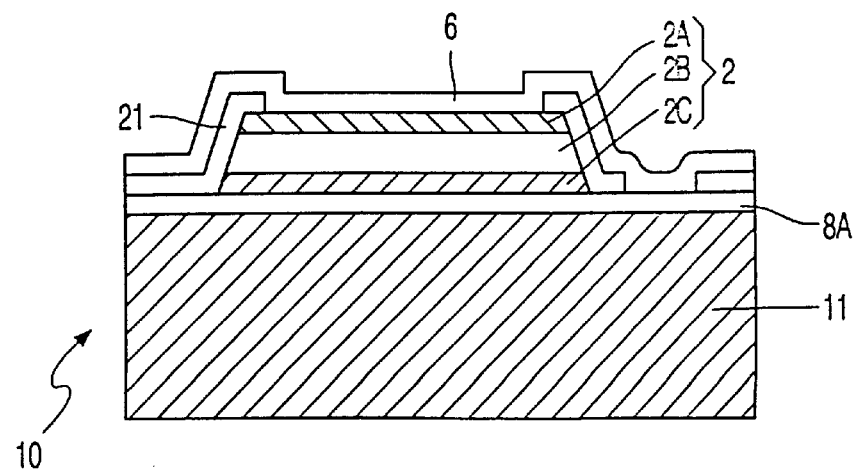
Figure 7:
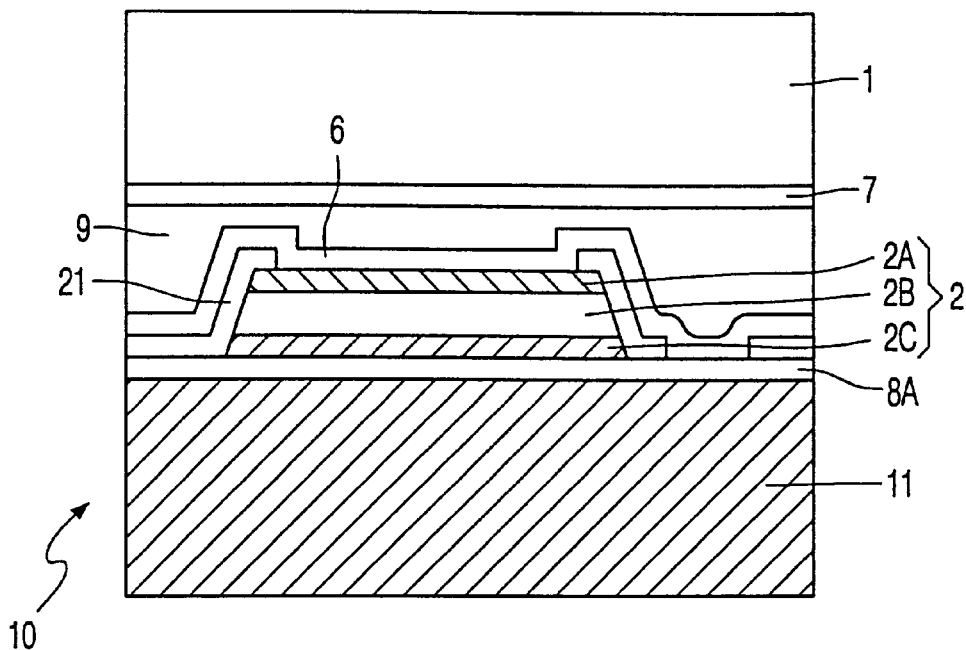
Figure 8:
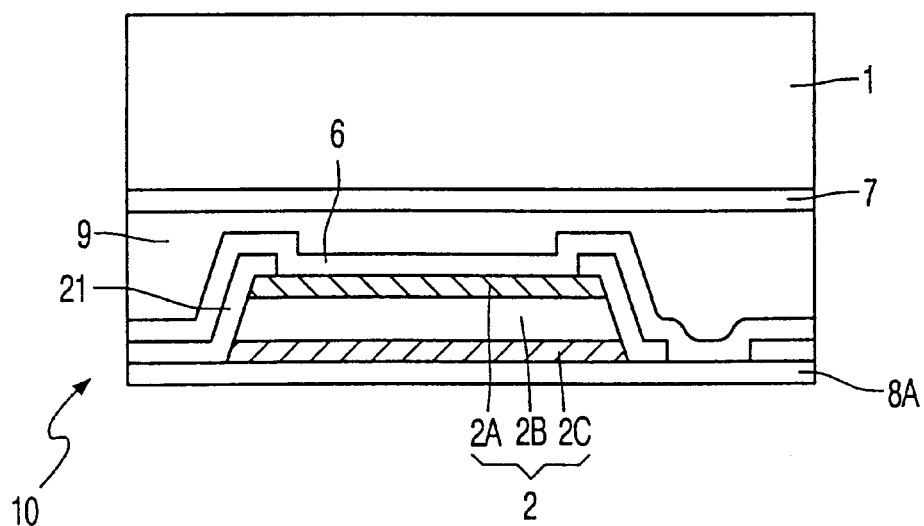

The Figures are schematic and not drawn to scale, particularly the dimensions in the thickness direction being exaggerated for clarity. Semiconductor regions of the same conductivity type are generally hatched in the same direction. In the different Figures, corresponding regions are indicated by the same reference numeral whenever possible.

DESCRIPTION OF THE PREFERRED EMBODIMENTS

FIG. 1 is a schematic, cross-sectional view, at right angles to the thickness direction, of a first embodiment of a radiation-sensitive device in accordance with the invention. The device comprises a semiconductor body 10 with a substrate 1 on which a semiconductor layer 2 is provided which is thin relative to the substrate 1. This semiconductor layer includes a radiation-sensitive element, in this case a photodiode, which is provided with two electrical connections 3, 4, and by means of which radiation 100 incident on the device can be detected. Radiation-reflecting means 6 are situated between the substrate 1 and the semiconductor layer 2. Also the surface 5, via which the radiation 100 to be detected enters the device, is partly reflecting. As a result, the device of this example is of the so-called resonant-cavity type.

In accordance with the invention, the radiation-reflecting means 6 comprise a metal layer 6, and the semiconductor layer 2 provided with the metal layer 6 is secured onto the substrate 1 by means of an adhesive layer 7. In this manner, it is achieved that the reflectivity of the rearmost mirror 6 of the two mirrors 5, 6 associated with the resonant cavity exhibit a reflectivity of at least substantially 1 for radiation 100 whose wavelength ranges between 0.4 $\mu$m and 10 $\mu$m. As a result, the device in accordance with the invention has a very high wavelength selectivity. In addition, the wavelength selectivity desired for a specific application, which application corresponds to a specific wavelength of the radiation to be detected, can be set very accurately and reproducibly, since, to determine the necessary reflectivity at the surface 5 of the device, it is not necessary to determine the reflectivity of the reflection means 6 by means of measurements such as ellipsometry and reflectivity measurements. In addition, the device in accordance with the invention can be readily manufactured using a method in accordance with the invention. In this connection, a further characteristic of the device in accordance with the invention is that the semiconductor layer 2 provided with the layer 6 is secured to the substrate 1 by means of an adhesive layer 7. As a result, the substrate 1 may also comprise a material other than a semiconductor material. In this example, the substrate 1 comprises glass. All this will be explained in greater detail when the manufacture of the device of this example is discussed hereinbelow.

It has been found that the device of this example has a very great wavelength selectivity, which becomes apparent from the presence of a very sharp oscillating variation of the response as a function of the wavelength. In addition, the device has a very high response rate. All this renders the device in accordance with the invention very suitable for use as a detector in a system for optical glass fiber communication in which use is made of the so-called (de) multiplexing technique or, as in this example, as a detector in an optical disc system in which a great wavelength selectivity is desired, for example, to eliminate the influence of background radiation on the response. In this example, the wavelength of the radiation 100 to be detected is 650 nm. The thickness of the semiconductor layer 2 amounts here to at least substantially 1 $\mu$m, which corresponds to an integral number of times, in this case 3 times, the half wavelength of the radiation 100 to be detected. The reflectivity at the mirror 6 is approximately 100%. Further, in connection with a resonant cavity effect of the device, the surface 5 of the semiconductor body 10 comprises further reflection means 8 which, in this example, include a 82 nm thick insulating layer 8A of silicon dioxide and a 70 nm thick further insulating layer 8B of silicon nitride. Thus, the reflectivity of the surface 5 is set to 50% for radiation having a wavelength of 650 nm.

The photodiode comprises a first semiconductor region 2A of a first, in this case p-, conductivity type, having a high doping concentration, and a second semiconductor region 2C of a second opposite conductivity type, that is in this case the n-conductivity type, having a high doping concentration, and in this case, also a third semiconductor region 2B of the first or second, in this case n-, conductivity type, which is situated between the first and the second semiconductor region 2A, 2C, and which has a low doping concentration. The electrical connections 3, 4 are connected, respectively, to the first and the second semiconductor region 2A, 2C. The semiconductor regions 2A, 2B, 2C comprise, in this example, a stack of (epitaxial) layers of silicon having thicknesses of, respectively, 0.2, 0.8 and 0.2 $\mu$m and having a doping concentration of, respectively, $10^{19}$, $1 \times 10^{13}$ and $5 \times 10^{18}$ at/cm$^3$. In this example, the metal layer 6 is made of aluminium and connected to the connection conductor 3, so that it forms part of the electrical connection 3. In this example, a further electrically insulating layer 9, which covers the photodiode on the side bordering on the substrate 1, is situated between the metal layer 6 and the adhesive layer 7 and comprises, in this case, silicon dioxide. The thickness of the glass layer 9, in this example, is approximately 1 $\mu$m. The adhesive layer 7 has a thickness in the range from 1 to 50 $\mu$m, in this example 20 $\mu$m, and comprises an epoxy or acrylate glue, in this example HDDA (=1,6 HexaneDiolDiacrylate). The substrate 1 is made of glass and has a thickness of 400 $\mu$m, while the length and the width are both 500 $\mu$m. The length and width of its photodiode each amount to 100 $\mu$m. The manufacture of the device of this example by means of a method in accordance with the invention will be discussed hereinbelow.

FIGS. 2 through 8 are schematic, cross-sectional views, at right angles to the thickness direction, of the device shown in FIG. 1 in successive stages of the manufacture by means of a method in accordance with the invention. Use is made (see FIG. 2) of a 675 $\mu$m thick monocrystalline substrate 11 having a diameter of 6 inch and of (100), antimony-doped, silicon having a doping concentration of $5 \times 10^{18}$ at/cm$^3$. The substrate 11 is provided with an insulating layer 8A of silicon dioxide by means of oxygen-ion implantation. The part 2C of the substrate 11, which is situated above said insulating layer, forms a part 2C of a semiconductor layer 2. Such a substrate 11 is also referred to as SIMOX (=Separation by Implantation of Oxygen) substrate. The remaining parts 2B, 2A of the semiconductor layer 2 are provided thereon (see FIG. 3) by means of an atmospheric CVD process at a temperature of 1000° C., a number of semiconductor layers thus being successively provided. To form the photodiode, an 0.5 $\mu$m thick masking layer 20 of silicon dioxide is provided on the semiconductor layer 2 by means of a gas phase deposition process.

Subsequently, (see FIG. 4) said masking layer 20 is patterned by means of photolithography and etching. Next, a mesa-shaped photodiode structure is formed in the semiconductor layer 2 by means of etching (using a 20% solution of KOH in a (saturated) mixture of water and isopropanol). In this operation, the insulating layer 8A serves as the etch-stop layer. Subsequently, (see FIG. 5) the masking layer 20 is removed and a further electrically insulating layer 21 is applied and provided with two apertures 40, 41. Subsequently, (see FIG. 6), an 1.5 $\mu$m thick metal layer 6, in this case aluminium, is vapor deposited onto the mesa-shaped structure and provided with a pattern. Next, (see FIG. 7), another electrically insulating, approximately 1 $\mu$m thick, layer 9 of silicon dioxide is provided by means of a plasma-deposition process. The resultant structure is substantially flat and is covered with a 20 $\mu$m thick adhesive layer 7 to which a substrate 1 is secured. Subsequently, (see FIG. 8) the substrate 11 is selectively removed by means of etching using the above-mentioned KOH solution. Also in this case, the electrically insulating layer 8A serves as the etch-stop layer. The electrically insulating layer 8A is subsequently covered with a further electrically insulating layer 8B, which is not shown in FIG. 7. The following steps, which are not shown either in FIG. 7, consist of the formation of contact apertures in the electrically insulating layers 8A, 8B and the provision of the (aluminium) connection conductors 3, 4. Finally, the individual device in accordance with the invention, as shown in FIG. 1, is obtained by means of, for example, cutting.

Figure 9:
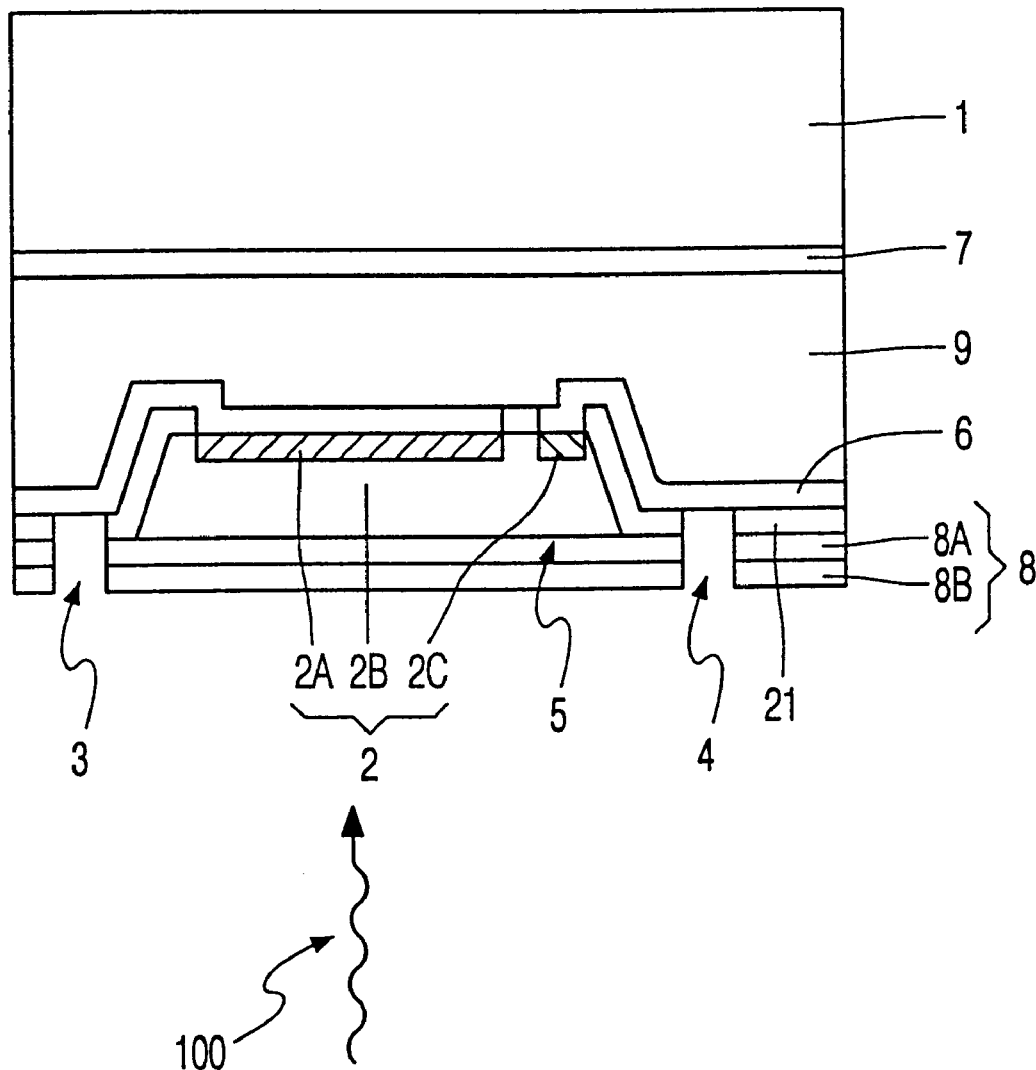
FIG. 9 is a schematic, cross-sectional view, at right angles to the thickness direction, of a second embodiment of a device in accordance with the invention.

Finally, FIG. 9 is a schematic, cross-sectional view, at right angles to the thickness direction, of a second, also very favorable embodiment of a device in accordance with the invention. The device of this example and the manufacture thereof differ in the following respects from the device of the above-described example. In the first place, the entire semiconductor layer 2 is formed so as to be the second semiconductor region 2B, which has a low doping concentration. The first and the third semiconductor regions 2A, 2C are formed so as to be regions which are recessed in the surface 5 of the semiconductor layer 2, and they are arranged at some distance from each other, here 1 $\mu$m. The radiation 100 to be detected enters the device at the location of the first semiconductor region 2A. A second difference relates to the absence of connection conductors 3, 4. In this example, these connection conductors are formed by (parts of) the metal layer 6, which are exposed at the location where the contact apertures are situated on the side of the radiation-sensitive surface. The dimensions of the first semiconductor region 2A are approximately equal to the dimensions of the photodiode, which has the same dimensions as in the first example. The other dimensions, layer thicknesses and doping concentrations are also the same as in the first example. Also the manufacture of the device of this example is very similar to that of the first example. The SIMOX structure used is high-ohmic in this example. After growing a high-ohmic epitaxial layer 2, the first and the second semiconductor regions 2A, 2C are formed therein by implantation. Subsequently, the mesa structure of the photodiode 2 is formed by etching. After the provision of the insulating layer 21, apertures are formed therein at the location of the semiconductor regions 2A, 2C. The metal layer 6 is then provided by vapor deposition and provided with a pattern. After the application of the insulating layer 9, the adhesive layer 7 and the glass substrate 1, the mirror 8 is completed at the radiation-sensitive surface 5 by applying the silicon nitride-containing layer 8B. After the formation of contact apertures in the insulating mirror 8 and cutting, the device of this example is ready for use.

The invention is not limited to the above examples, since within the scope of the invention, many modifications and variations are possible to those skilled in the art. For example, the materials, compositions and thicknesses for the different (semiconductor) regions or layers may differ from those used in the examples. It is also possible to use deposition techniques other than the ones mentioned, such as MBE (=Molecular Beam Epitaxy). A silicon dioxide-containing layer may also be obtained by oxidation, taking into account the fact that the thickness of an underlying layer of silicon changes as a result of said technique.

It is very attractive to base the manufacture on a SIMOX substrate, however, also other SOI (=Silicon On Insulator) structures, such as BESOI (=Bond and Etch back Silicon On Insulator) can be used for this purpose.

A broad-band response, which is desirable for specific applications, can be obtained by deliberately roughening the interface between the semiconductor material and the metal layer or the other reflecting interface. To increase the sensitivity of the device to, in particular, relatively long-wave radiation, the semiconductor layer may comprise one or more sub-layers having a lower band gap, such as germanium sub-layers in a silicon semiconductor layer. A device in accordance with the invention can also be a more complex device than a single diode. For example, an electronic detector circuit may be integrated, so that the device forms an IC (=Integrated Circuit).5.

What is claimed is:

1. A radiation-sensitive semiconductor device comprising a semiconductor body (10) including a substrate (1) carrying a semiconductor layer (2), which is thin relative to the substrate and which comprises a radiation-sensitive semiconductor material, in which the semiconductor layer within a semiconductor element having electrical connections (3, 4) is formed which is sensitive to electromagnetic radiation (100) incident on the surface (5) of the semiconductor body (10), and radiation-reflecting means (6) being provided between the substrate (1) and the semiconductor layer (2), characterized in that the radiation-reflecting means (6) comprise a metal layer (6) bordering on the semiconductor layer (2), and the semiconductor layer (2) provided with a metal layer (6) is secured to the substrate (1) by means of an adhesive layer (7).

2. A radiation-sensitive semiconductor device as claimed in claim 1, characterized in that further reflection means (8) are situated at the surface (5) of the semiconductor body (10) and the thickness of the semiconductor layer (2) is a small number of times the half wavelength of the electromagnetic radiation (100) to be detected.

3. A radiation-sensitive semiconductor device as claimed in claim 1, characterized in that the radiation-sensitive element comprises a diode having a first semiconductor region (2A) of a first conductivity type with a high doping concentration, and a second semiconductor region (2C) of a second conductivity type, which is opposite to the first conductivity type, and with a high doping concentration, and preferably, a third semiconductor region (2B), situated between the first and the second semiconductor regions (2A, 2C), which is of the first or the second conductivity type and has a low doping concentration, and the first and second semiconductor regions (2A, 2C) being provided with electrical connections (3, 4).

4. A radiation-sensitive semiconductor device as claimed in claim 3, characterized in that the semiconductor layer (2) comprises a stack of epitaxial semiconductor layers (2A, 2B, 2C) which successively constitute the first (2A), the second (2B) and the third (2C) semiconductor region.

5. A radiation-sensitive semiconductor device as claimed in claim 3, characterized in that the semiconductor layer (2) forms the second semiconductor region (2B) in which the first and the second semiconductor regions (2A, 2C) are recessed next to each other.

6. A radiation-sensitive semiconductor device as claimed in claim 1, characterized in that the metal layer (6) also forms one (3) of the electrical connections (3, 4) of the semiconductor element.

7. A radiation-sensitive semiconductor device as claimed in claim 1, characterized in that the substrate (1) is made of glass, and an electrically insulating layer (9) is situated between the metal layer (6) and the adhesive layer (7).

* * * * *